United States Patent
Harumoto et al.

(10) Patent No.: US 8,137,576 B2
(45) Date of Patent: Mar. 20, 2012

(54) SUBSTRATE DEVELOPING METHOD AND DEVELOPING APPARATUS

(75) Inventors: Masahiko Harumoto, Shimogyo-ku (JP); Akira Yamaguchi, Shimogyo-ku (JP); Akihiro Hisai, Shimogyo-ku (JP)

(73) Assignee: Sokudo Co., Ltd., Kyoto (JP)

( * ) Notice: Subject to any disclaimer, the term of this patent is extended or adjusted under 35 U.S.C. 154(b) by 1070 days.

(21) Appl. No.: 12/032,582

(22) Filed: Feb. 15, 2008

(65) Prior Publication Data

US 2008/0203058 A1  Aug. 28, 2008

(30) Foreign Application Priority Data

Feb. 23, 2007  (JP) ................. 2007-044042

(51) Int. Cl.
*B44C 1/22* (2006.01)
*C23F 1/00* (2006.01)
(52) U.S. Cl. .......................... 216/83; 216/91
(58) Field of Classification Search .......... None
See application file for complete search history.

(56) References Cited

U.S. PATENT DOCUMENTS

| | | | | |
|---|---|---|---|---|
| 4,592,787 A * | 6/1986 | Johnson | ...... | 134/38 |
| 5,139,607 A * | 8/1992 | Ward et al. | ...... | 216/83 |
| 5,145,764 A * | 9/1992 | Bauer et al. | ...... | 430/260 |
| 5,158,860 A * | 10/1992 | Gulla et al. | ...... | 430/315 |
| 5,191,908 A * | 3/1993 | Hiroe et al. | ...... | 134/76 |
| 5,262,279 A * | 11/1993 | Tsang et al. | ...... | 430/311 |
| 5,292,445 A * | 3/1994 | Fjare et al. | ...... | 252/79.5 |
| 5,308,745 A * | 5/1994 | Schwartzkopf | ...... | 430/329 |
| 5,381,807 A * | 1/1995 | Lee | ...... | 134/2 |
| 5,470,693 A * | 11/1995 | Sachdev et al. | ...... | 430/315 |
| 5,678,116 A * | 10/1997 | Sugimoto et al. | ...... | 396/611 |
| 5,853,961 A * | 12/1998 | Sakai et al. | ...... | 430/325 |
| 6,090,205 A * | 7/2000 | Sakai et al. | ...... | 118/500 |
| 6,159,666 A * | 12/2000 | Ngo et al. | ...... | 430/329 |
| 7,364,625 B2 * | 4/2008 | Christenson et al. | ...... | 134/2 |
| 7,422,641 B2 * | 9/2008 | Nakajima et al. | ...... | 134/26 |
| 7,494,549 B2 * | 2/2009 | Eitoku | ...... | 134/26 |
| 7,803,230 B2 * | 9/2010 | Amai et al. | ...... | 134/6 |
| 7,946,299 B2 * | 5/2011 | Franklin et al. | ...... | 134/102.1 |
| 2002/0170573 A1 * | 11/2002 | Christenson et al. | ...... | 134/2 |
| 2003/0084925 A1 * | 5/2003 | Nakajima et al. | ...... | 134/26 |
| 2004/0031503 A1 * | 2/2004 | Eitoku | ...... | 134/2 |
| 2004/0154641 A1 * | 8/2004 | Montierth | ...... | 134/3 |

(Continued)

FOREIGN PATENT DOCUMENTS

JP    08-064514    3/1996

(Continued)

*Primary Examiner* — Allan Olsen
(74) *Attorney, Agent, or Firm* — Kilpatrick Townsend & Stockton LLP (57) ABSTRACT

A method for developing a substrate includes a developing step for supplying a developer to the substrate, and a neutralizing and removing step for supplying a treating solution containing a neutralizing material to the substrate to neutralize the developer, and neutralizing the developer and removing the developer from the substrate. In the neutralizing and removing step, the developer is neutralized by the treating solution. This neutralization reaction forms a product (salt) which easily melts into the treating solution and does not precipitate. Thus, the product is removable from the substrate along with the treating solution. Therefore, the developer is inhibited from remaining on the substrate. As a result, it is possible to prevent post-develop defects due to "residues of the developer" or the developer remaining on the substrate.

11 Claims, 6 Drawing Sheets

U.S. PATENT DOCUMENTS

| | | | |
|---|---|---|---|
| 2005/0115596 A1* | 6/2005 | Nakajima et al. | 134/94.1 |
| 2005/0115671 A1* | 6/2005 | Araki | 156/345.12 |
| 2007/0175501 A1* | 8/2007 | Amai et al. | 134/149 |
| 2007/0234951 A1* | 10/2007 | Lu et al. | 118/300 |
| 2007/0246081 A1* | 10/2007 | Lu et al. | 134/33 |
| 2008/0203058 A1* | 8/2008 | Harumoto et al. | 216/83 |
| 2010/0154833 A1* | 6/2010 | Endo et al. | 134/26 |

FOREIGN PATENT DOCUMENTS

JP 2000-315643 11/2000

* cited by examiner

SUBSTRATE DEVELOPING METHOD AND DEVELOPING APPARATUS

CROSS-REFERENCES TO RELATED APPLICATIONS

This application claims priority to Japanese Patent Application 2007-044042, filed Feb. 23, 2007. The disclosure of JP 2007-044042 is hereby incorporated by reference in its entirety for all purposes.

BACKGROUND OF THE INVENTION

This invention relates to a substrate developing method and developing apparatus for developing semiconductor wafers, glass substrates for liquid crystal displays, glass substrates for photomasks, and substrates for optical disks (hereinafter called simply "substrates").

A developing apparatus may include a spin chuck for rotatably supporting a substrate, and a nozzle for supplying a developer to the substrate. This apparatus supplies the developer to the substrate held by the spin chuck to dissolve parts other than pattern parts of resist film formed on the surface of the substrate. Then, the apparatus cleans and dries the substrate to remove the dissolved resist film. Such an apparatus is described, for example, in Japanese Unexamined Patent Publication No. 2000-315643.

The conventional apparatus with the above construction has several drawbacks. The above cleaning process can fail to wash the developer away from the substrate sufficiently, whereby the developer will remain on or in the resist film. In addition, in the drying process, it is difficult to evaporate the developer completely because of the characteristics of the developer. The above condition will result in an inconvenience that the developer remaining on the substrate becomes post-develop defects. There is a further inconvenience that, when conducting an image inspection of electrical properties of lines formed on the resist film, the residual developer can hide defects of the lines, whereby the inspection cannot be carried out properly.

SUMMARY OF THE INVENTION

This invention has been made having regard to the state of the art noted above, and its object is to provide a substrate developing method and developing apparatus that can inhibit a developer from remaining on a substrate.

The above object is fulfilled, according to an embodiment of the present invention, by a substrate developing method for developing a substrate, comprising a developing step for supplying a developer to the substrate; and a neutralizing and removing step for supplying a treating solution containing a neutralizing material to the substrate to neutralize the developer, and neutralizing the developer and removing the developer from the substrate.

According to embodiments of the invention, in the neutralizing and removing step, the developer is neutralized by the treating solution. This neutralization reaction forms a product (salt) which easily melts into the treating solution and does not precipitate. Thus, the product is removable from the substrate along with the treating solution. Therefore, the developer is inhibited from remaining on the substrate. As a result, it is possible to prevent post-develop defects due to "residues of the developer" or the developer remaining on the substrate.

In the above method, the treating solution may be acid. Then, the developer can be neutralized effectively. The neutralizing material may include at least one of carbon dioxide, hydrogen peroxide and carboxylic acid. Then, the developer can be neutralized effectively. The neutralizing and removing step may be executed to spray droplets of the treating solution on the substrate. This promotes the neutralization of the developer. The neutralizing and removing step may be executed to supply the treating solution to the substrate in a spin. Then, the developer can be neutralized over the entire surface of the substrate.

The method according to embodiments of the invention may further include a rinsing step for supplying a rinsing liquid to the substrate, and a developer scattering step for scattering the developer from the substrate by spinning the substrate, which steps are executed after the developing step and before the neutralizing and removing step. Since the developer is neutralized after reducing the developer to minute amount, the developer is inhibited from remaining on the substrate highly effectively.

The method according to embodiments of the invention may further include a developer scattering step for scattering the developer from the substrate by spinning the substrate, which step is executed after the developing step and before the neutralizing and removing step. Since the developer is neutralized after reducing the amount of the developer on the substrate, the developer is inhibited from remaining on the substrate highly effectively.

In another aspect of the invention, a substrate developing method for developing a substrate includes a developing step for supplying a developer to the substrate, a neutralizing step for supplying a neutralizing material to the substrate to neutralize the developer, and a removing step for supplying a cleaning liquid to the substrate and removing a product formed by neutralization of the developer from the substrate.

According to embodiments of the invention, in the neutralizing step, the developer is neutralized by the treating solution. This neutralization reaction forms a product (salt). In the removing step, the product (salt) is dissolved in the treating solution to be removable from the substrate along with the treating solution. Therefore, the developer is inhibited from remaining on the substrate. As a result, it is possible to prevent post-develop defects due to residues of the developer.

In the above method, the neutralizing step may be executed to direct carbon dioxide gas to the substrate. Then, the developer can be neutralized effectively.

In a different aspect of the invention, a substrate developing apparatus for developing a substrate includes a spin-support device for rotatably supporting the substrate, a developer supply device for supplying a developer to the substrate, a treating solution supply device for supplying a treating solution containing a neutralizing material for neutralizing the developer, and a control device for carrying out a neutralizing and removing process by supplying the treating solution to the substrate, after the developer is supplied to the substrate, to neutralize the developer and remove the developer from the substrate.

According to an embodiment of the present invention, the treating solution supply device can neutralize the developer on the substrate. This neutralization reaction forms a product (salt) which easily melts into the treating solution and does not precipitate. Thus, the product is removable from the substrate along with the treating solution. Therefore, the developer is inhibited from remaining on the substrate. As a result, it is possible to prevent post-develop defects due to "residues of the developer" or the developer remaining on the substrate.

In the above apparatus, the treating solution may be acid. Then, the developer can be neutralized effectively. The neutralizing material may include at least one of carbon dioxide, hydrogen peroxide and carboxylic acid. Then, the developer can be neutralized effectively. The treating solution supply device may be arranged to spray droplets of the treating solution on the substrate. This promotes the neutralization of the developer. The control device may be arranged to supply the treating solution to the substrate being spun by the spin-support device. Then, the developer can be neutralized over the entire surface of the substrate.

The control device may be arranged to cause the spin-support device to spin the substrate supplied with the developer, thereby scattering the developer from the substrate, and subsequently to carry out the neutralizing and removing process. Since the developer is neutralized after reducing the amount of the developer on the substrate, the developer is inhibited from remaining on the substrate highly effectively.

The apparatus according to the invention may further include a rinsing liquid supply device for supplying a rinsing liquid to the substrate. The control device is arranged to cause the spin-support device to spin the substrate supplied with the developer, thereby scattering the developer from the substrate, and subsequently to carry out the neutralizing and removing process. Since the developer is neutralized after reducing the developer to minute amount, the developer is inhibited from remaining on the substrate highly effectively.

In a further aspect of the invention, a substrate developing apparatus for developing a substrate include a spin-support device for rotatably supporting the substrate, a developer supply device for supplying a developer to the substrate, a neutralizing material supply device for supplying a neutralizing material to the substrate to neutralize the developer, a cleaning liquid supply device for supplying a cleaning liquid to the substrate, and a control device for carrying out a neutralizing process by supplying the neutralizing material to the substrate, after the developer is supplied to the substrate, and a removing process for supplying the cleaning liquid to the substrate and removing a product formed by neutralization of the developer from the substrate.

According to an embodiment of the invention, the neutralizing material supply device can neutralize the developer on the substrate. This neutralization reaction forms a product (salt). The cleaning liquid supply device can dissolve the product (salt) in the treating solution to be removable from the substrate along with the treating solution. Therefore, the developer is inhibited from remaining on the substrate. As a result, it is possible to prevent post-develop defects due to residues of the developer. The neutralizing material supply device may be arranged to supply carbon dioxide gas to the substrate. Then, the developer can be neutralized effectively.

The control device may be arranged to carry out the neutralizing process and the removing process in parallel by causing the cleaning liquid supply device to supply the cleaning liquid when causing the neutralizing material supply device to supply the neutralizing material. Then, the developer can be neutralized and removed from the substrate efficiently.

The control device may be arranged to carry out the neutralizing process while causing the spin-support device to spin the substrate. Then, the developer can be neutralized over the entire surface of the substrate.

The invention disclosed in this specification relates also to the following developing method and developing apparatus. The method may include the use of a treating solution that is an aqueous solution of the neutralizing material. Accordingly, the developer can be neutralized effectively. In some embodiments, the neutralizing material includes at least one of carbon dioxide, hydrogen peroxide, or carboxylic acid. As a result, the developer can be neutralized effectively. As an example, the neutralizing step and the removing step are executed in parallel by spraying droplets of the cleaning liquid along with carbon dioxide gas acting as the neutralizing material, thereby promoting neutralization of the developer. Additionally, the neutralizing step may be executed to supply the neutralizing material to the substrate in a spin. Hence, the developer can be neutralized over the entire surface of the substrate.

Another embodiment further includes a rinsing step for supplying a rinsing liquid to the substrate and a first drying step for scattering the developer from the substrate by spinning the substrate. These steps are executed after the developing step and before the neutralizing step and the removing step. The developer is neutralized after reducing the developer to a minute amount and therefore the developer can be removed from the substrate effectively.

In an alternative embodiment, the method further includes a developer scattering step for scattering the developer from the substrate by spinning the substrate. This step is executed after the developing step and before the neutralizing step and the removing step. In this alternative embodiment, the developer is neutralized after reducing the amount of the developer on the substrate and therefore the developer can be removed from the substrate effectively. The removing step may be executed to supply the cleaning liquid to the substrate in a spin so that the developer can be neutralized over the entire surface of the substrate.

In a particular embodiment, the cleaning liquid is deionized water and the developer is thus neutralized effectively. The treating solution may be an aqueous solution of the neutralizing material and the developer can be neutralized effectively. Additionally, in some embodiments, the neutralizing material includes at least one of carbon dioxide, hydrogen peroxide, or carboxylic acid, thereby neutralizing the developer effectively.

An apparatus is provided by an embodiment in which the control device is arranged to cause the spin-support device to spin the substrate supplied with the developer, thereby scattering the developer from the substrate, and subsequently to carry out the neutralizing process and the removing process. In this embodiments, the developer is neutralized after reducing the amount of the developer on the substrate, and therefore the developer can be removed from the substrate effectively. Additionally, the control device may be arranged to supply the cleaning liquid from the cleaning liquid supply device to the substrate supplied with the developer, to cause the spin-support device to spin the substrate, thereby scattering the cleaning liquid from the substrate, and subsequently to carry out the neutralizing process and the removing process. As a result, the developer is neutralized after reducing the developer to a minute amount and therefore the developer can be removed from the substrate effectively. As an example, the cleaning liquid may be deionized water. Additionally, an aqueous solution of the neutralizing material dissolved in deionized water can act as a treating solution.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DETAILED DESCRIPTION OF SPECIFIC EMBODIMENTS

Preferred embodiments of the invention will be described in detail hereinafter with reference to the drawings.

Figure 1:
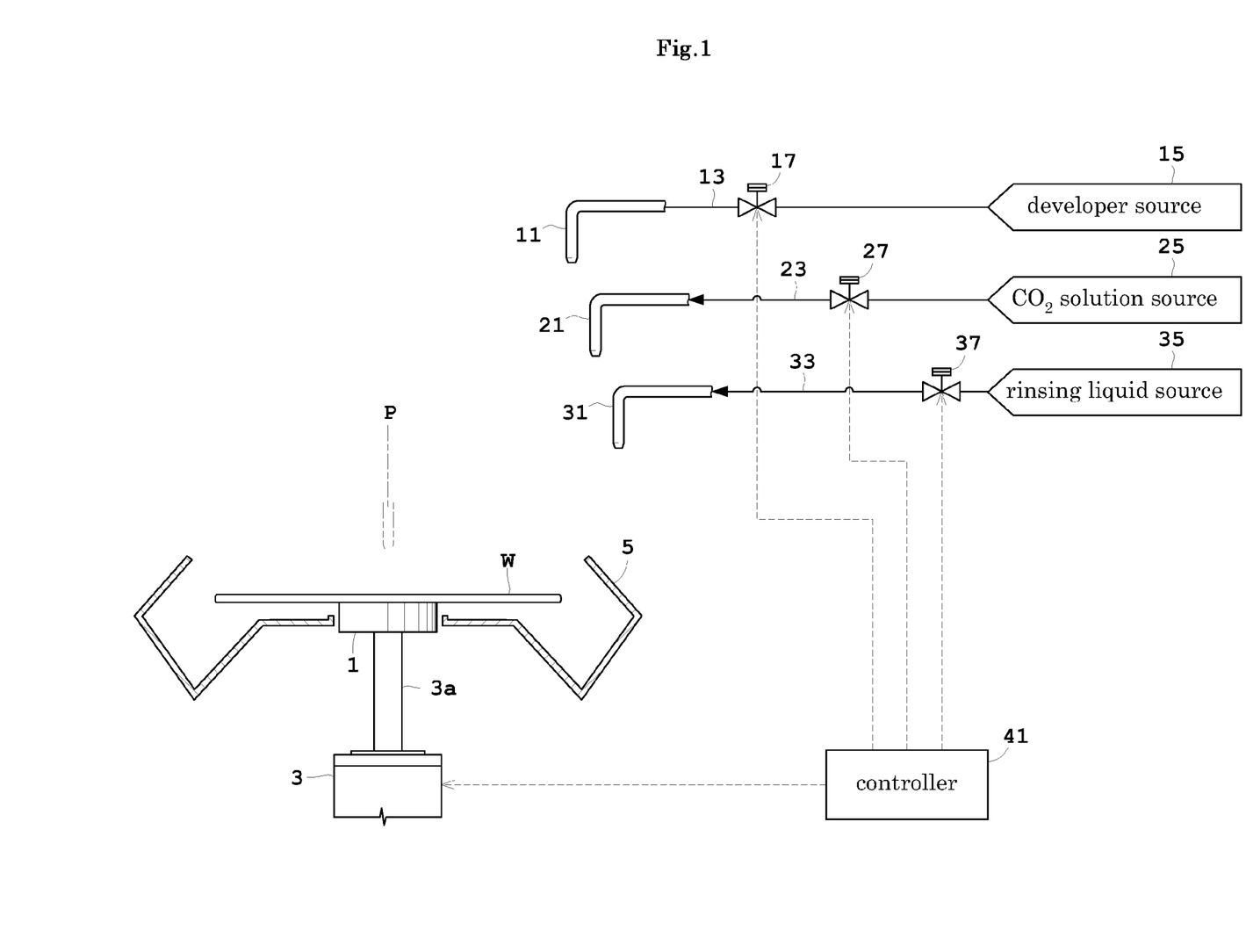
FIG. 1 is a block diagram showing an outline of a developing apparatus in a first embodiment.

A first embodiment of the invention will be described with reference to the drawings. FIG. 1 is a block diagram showing an outline of a developing apparatus in the first embodiment.

The developing apparatus in this embodiment includes a spin chuck 1 for supporting a wafer W in horizontal posture by sucking the lower surface thereof. The spin chuck 1 has an output shaft 3a of a motor 3 connected thereto. The motor 3 spins the wafer W about a vertical axis. The spin chuck 1 is surrounded by a scatter preventive cup 5. The scatter preventive cup 5 functions to guide downward and collect a developer and other materials scattering from peripheries of the wafer W to the ambient. The spin chuck 1 and motor 3 constitute the spin-support device in this invention. However, the spin-support device is not limited to the above example, but may be a spin disk with a plurality of pins arranged thereon for supporting edges of the wafer W.

The apparatus further includes a developer nozzle 11 for supplying a developer, a treating solution nozzle 21 for supplying carbonated water having carbon dioxide dissolved in deionized water (hereinafter called "$CO_2$ solution"), and a rinse nozzle 31 for supplying a rinsing liquid. The $CO_2$ solution is weakly acid. Each of the nozzles 11, 21 and 31 is supported by an arm, not shown, to be movable between a treating position substantially over the center P of the wafer W (position shown in a two-dot chain line in FIG. 1) and a standby position away from over the wafer W (each position being shown in a solid line in FIG. 1). The carbon dioxide corresponds to the neutralizing material in some embodiments of the invention. The $CO_2$ solution corresponds to the treating solution in some embodiments of the invention.

The developer nozzle 11 is connected to one end of developer piping 13 having the other end connected to a developer source 15. The developer piping 13 has a switch valve 17 mounted thereon for opening and closing a developer flow passage. The developer nozzle 11 corresponds to the developer supply device in this invention.

Similarly, the treating solution nozzle 21 is connected to one end of treating solution piping 23 having the other end connected to a $CO_2$ solution source 25. The treating solution piping 23 has a switch valve 27 mounted thereon for opening and closing a treating solution flow passage. The rinse nozzle 31 is connected to one end of rinse piping 33 having the other end connected to a rinsing liquid source 35. The rinse piping 33 has a switch valve 37 mounted thereon for opening and closing a rinsing liquid flow passage. The treating solution nozzle 21 and rinse nozzle 31 correspond to the treating solution supply device and rinsing liquid supply device in this invention, respectively.

The apparatus includes also a controller 41 for controlling the components described above. Specifically, the controller 41 controls spinning rates of the wafer W by driving the motor 3, controls positions of the nozzles 11, 21 and 31 by driving the arms not shown, and controls supply quantities of the developer, $CO_2$ solution and rinsing liquid by opening and closing the switch valves 17, 27 and 37. The controller 41 has treating recipes (treating programs) and the like stored therein beforehand, and performed an overall control of the apparatus by selecting a treating recipe according to treatment information of wafers W inputted in a lot as a unit. The controller 41 is realized by a central processing unit (CPU) for performing various processes, a RAM (Random-Access Memory) used as workspace of computations, and a storage medium such as a fixed disk for storing a variety of information.

Next, three processing examples of the developing apparatus will be described with reference to the drawings. It is assumed here that a wafer W with resist film formed thereon is already suction-supported by the spin chuck 1.

PROCESSING EXAMPLE 1

Figure 2A:
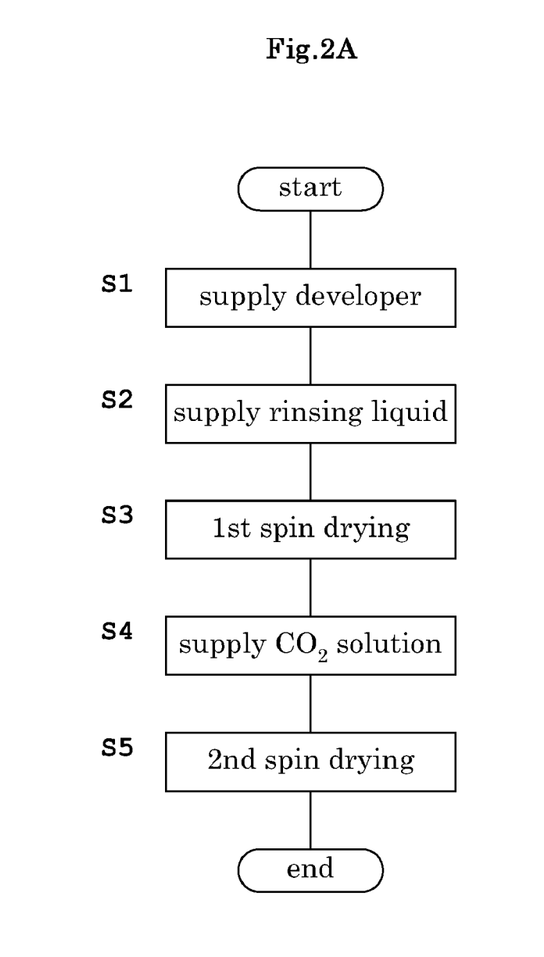
FIG. 2A is a flow chart of operation of processing example 1 for developing a substrate.

FIG. 2A is a flow chart showing operation of processing example 1 for developing the wafer W. Each step will be described hereinafter.

<Step S1> Supply Developer (Developing Step)

The controller 41 moves the developer nozzle 11 to the treating position substantially over the center P of the wafer W and opens the switch valve 17 while driving the motor 3 to spin the wafer W held by the spin chuck 1. The developer nozzle 11 supplies the developer from the developer source 15 to the wafer W. The developer supplied to the wafer W spreads over the wafer W under centrifugal force, and develops the wafer W. Upon lapse of a predetermined period, the controller 41 closes the switch valve 17, and returns the developer nozzle 11 to the standby position.

<Step S2> Supply Rinsing Liquid (Rinsing Step)

The controller 41 moves the rinse nozzle 31 to the treating position, and opens the switch valve 37. The rinse nozzle 31 supplies the rinsing liquid from the rinsing liquid source 35 to the wafer W. As a result, the developer on the wafer W is washed away by the rinsing liquid to be discarded from the wafer W along with the rinsing liquid. Upon lapse of a predetermined period, the controller 41 closes the switch valve 37, and returns the rinse nozzle 31 to the standby position.

<Step S3> First Spin Drying (First Drying Step)

The controller 41 spins the wafer W at increased speed. As a result, the rinsing liquid is scattered from the wafer W to dry the wafer W.

<Step S4> Supply $CO_2$ Solution (Neutralizing and Removing Step)

The controller 41 reduces the number of rotations of the wafer W, moves the treating solution nozzle 21 to the treating position, and opens the switch valve 27. The treating solution nozzle 21 supplies the $CO_2$ solution from the $CO_2$ solution source 25 to the wafer W. The $CO_2$ solution spreads over the entire wafer W, and neutralizes the developer remaining in varied positions on the wafer W, e.g. on the surface of resist film and inside the resist film. As a result, the developing reaction stops completely over the entire wafer W. The developer undergoes a neutralization reaction with the $CO_2$ solution to form a product (salt). This product easily melts into the $CO_2$ solution without precipitating. The product having melted into the $CO_2$ solution is scattered from the wafer W along with the $CO_2$ solution to be discarded.

<Step S5> Second Spin Drying

The controller 41 spins the wafer W at increased speed again to dry the wafer W while scattering the $CO_2$ solution from the wafer W.

According to processing example 1, as described above, the $CO_2$ solution is supplied (step S4) to neutralize the developer and render the developer soluble in the $CO_2$ solution. In this way, the developer on the wafer W can be removed effectively from the wafer W. Thus, the developer is inhibited from remaining on the wafer W to prevent post-develop defects.

Since the $CO_2$ solution is supplied while spinning the wafer W, the developer can be neutralized uniformly over the entire wafer W.

Further, the rinsing liquid is supplied (step S2) after the developer is supplied (step S1) and before the $CO_2$ solution (step S4). This rinsing liquid can wash away the developer present mainly on the surface of resist film formed on the wafer W. The step of supplying the rinsing liquid is followed by the first spin drying (step S3) which scatters the rinsing liquid from the wafer W, and raises to the resist surface the developer having soaked into the resist film. Since the developer to be neutralized in step S4 is in minute amount, the developer can fully be subjected to the neutralization reaction. Since the $CO_2$ solution is supplied in a state where part of the developer has seeped out to the resist surface, the neutralization reaction of the developer can progress efficiently. Thus, the developer is effectively inhibited from remaining on the wafer W.

PROCESSING EXAMPLE 2

Figure 2B:
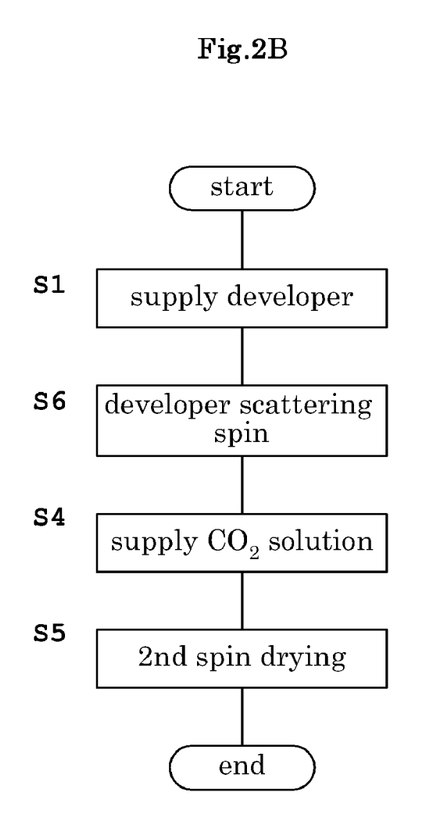
FIG. 2B is a flow chart of operation of processing example 2 for developing a substrate.

FIG. 2B is a flow chart showing operation of processing example 2 for developing a wafer. Like reference signs are used to identify like steps which are the same as in processing example 1 and will be described only briefly.

<Step S1> Supply Developer (Developing Step)

The developer is supplied to the wafer W in a spin.

<Step S6> Developer Scattering Spin

The controller 41 spins the wafer W at increased speed, to scatter the developer from the wafer W.

<Step S4> Supply $CO_2$ Solution (Neutralizing and Removing Step)

The controller 41 reduces the number of rotations of the wafer W, and supplies the $CO_2$ solution to the wafer W. As a result, the developer is neutralized and removed from the wafer W.

<Step S5> Second Spin Drying

The controller 41 spins the wafer W at increased speed again to dry the wafer W while scattering the $CO_2$ solution from the wafer W.

In this processing example 2, as in processing example 1, the $CO_2$ solution is supplied (step S4) to remove the developer effectively from the wafer W, thereby preventing post-develop defects.

According to processing example 2, the developer is scattered from the wafer W to be discarded after the developer is supplied (step S1) and before the $CO_2$ solution (step S4). This reduces the developer on the wafer W to a minute amount. Consequently, the developer on the wafer W can be fully neutralized. The developer is effectively inhibited from remaining on the wafer W.

PROCESSING EXAMPLE 3

Figure 2C:
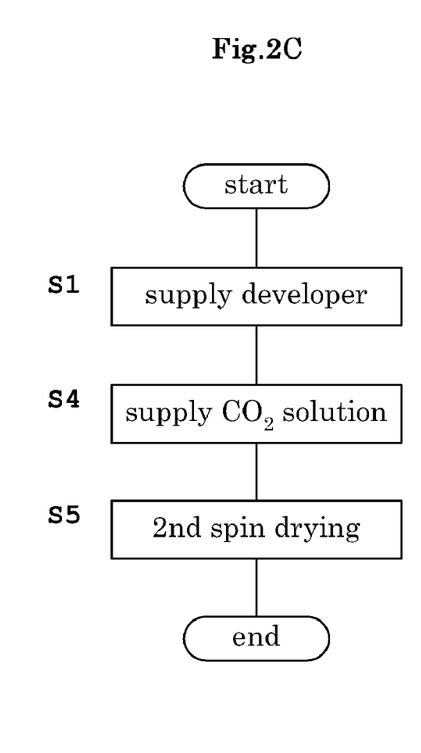
FIG. 2C is a flow chart of operation of processing example 3 for developing a substrate.

FIG. 2C is a flow chart showing operation of processing example 3 for developing a wafer. Like reference signs are used to identify like steps which are the same as in processing example 1 and will be described only briefly.

The controller 41 supplies the developer to the wafer W while spinning the wafer W (step S1). Then, the controller 41 supplies the $CO_2$ solution to the wafer W (step S4). As a result, the developer is neutralized and removed from the wafer W. Next, the controller 41 spins the wafer W at increased speed again to dry the wafer W while scattering the $CO_2$ solution from the wafer W (step S5).

In this processing example 3, as in processing example 1, the $CO_2$ solution is supplied (step S4) to remove the developer effectively from the wafer W, thereby preventing post-develop defects.

Where, as in processing example 3, step S2 for supplying the rinsing liquid is omitted, the apparatus may be modified to exclude the rinse nozzle 31 and the rinsing liquid source 35 and so on associated with the nozzle 31.

Second Embodiment

Figure 3:
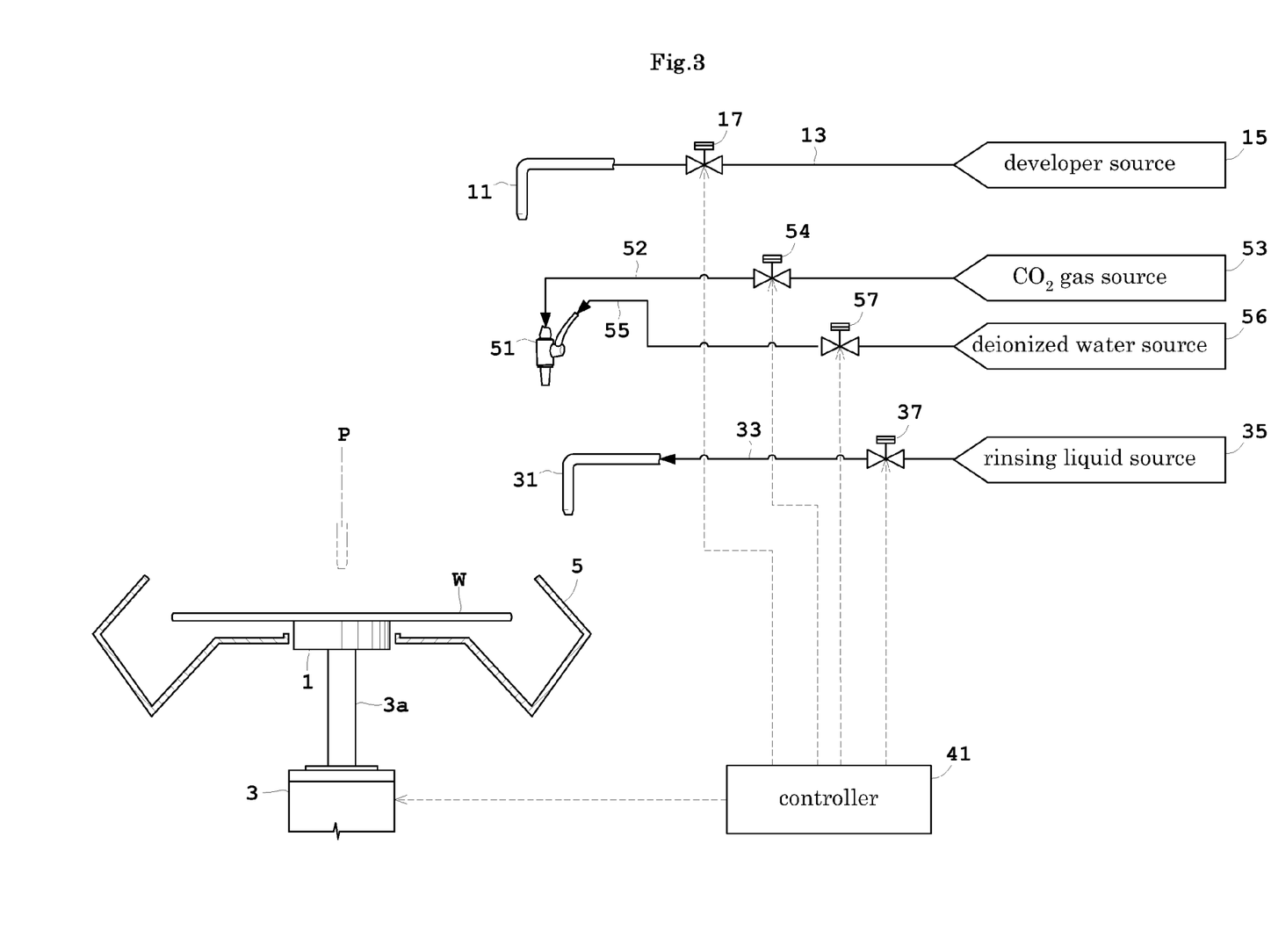
FIG. 3 is a block diagram showing an outline of a developing apparatus in a second embodiment.

A second embodiment of the invention will be described with reference to the drawings. FIG. 3 is a block diagram showing an outline of a developing apparatus in the second embodiment. Like reference signs are used to identify like components which are the same as in the first embodiment and will not particularly be described.

The apparatus in this embodiment includes a two-fluid nozzle 51 in place of the treating solution nozzle 21 described in the first embodiment. The two-fluid nozzle 51 has a double tube structure including an outer tube for receiving pressurized carbon dioxide gas (hereinafter referred to as $CO_2$ gas), and an inner tube for receiving deionized water. The nozzle 51 includes also a mixing chamber for forming a confluence of the $CO_2$ gas and deionized water (the inner and outer tubes and mixing chamber being not shown in FIG. 3). The nozzle 51 generates droplets in the mixing chamber, and sprays the droplets from a discharge bore. These droplets generated are droplets of a $CO_2$ solution which is a mixture of deionized water and $CO_2$ gas. The two-fluid nozzle 51 also is supported by an arm not shown, to be movable between a treating position substantially over the center P of the wafer W (position shown in a two-dot chain line in FIG. 3) and a standby position away from over the wafer W (position shown in solid lines in FIG. 3). The $CO_2$ gas corresponds to the neutralizing material in this embodiment of the invention. The $CO_2$ solution corresponds to the treating solution in this embodiment of the invention.

The two-fluid nozzle 51 has gas piping 52 and deionized water piping 55 connected thereto. The other end of the gas piping 52 is connected to a $CO_2$ gas source 53. The gas piping 52 has a switch valve 54 mounted thereon for opening and closing a $CO_2$ gas flow passage. The other end of the deionized water piping 55 is connected to a deionized water source 56. The deionized water piping 55 has a switch valve 57 mounted thereon for opening and closing a deionized water passage. The two-fluid nozzle 51 corresponds to the treating solution supply device in this embodiment of the invention.

The controller 41 further controls supply quantities of the $CO_2$ gas and deionized water by opening and closing the switch valves 54 and 57.

Next, three processing examples of the developing apparatus will be described with reference to the drawings. It is assumed here that a wafer W with resist film formed thereon is already suction-supported by the spin chuck 1.

PROCESSING EXAMPLE 4

Figure 4A:
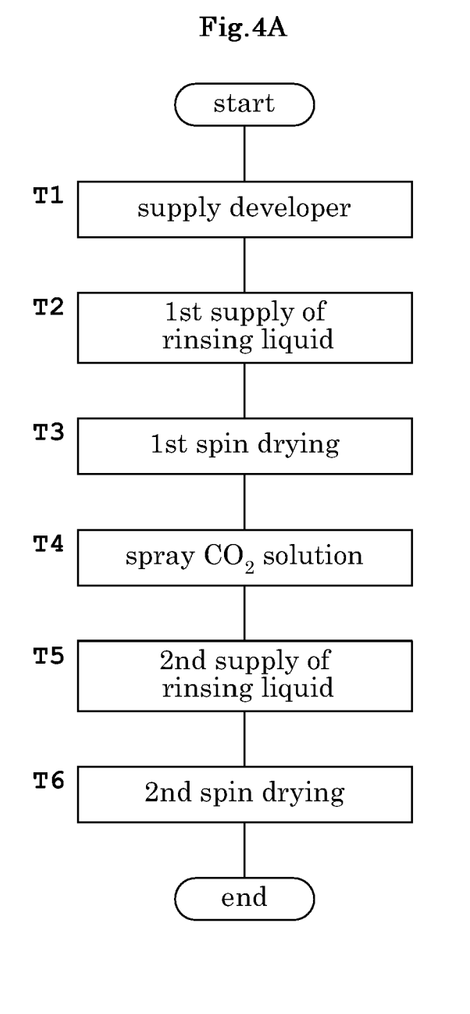
FIG. 4A is a flow chart of operation of processing example 4 for developing a substrate.

FIG. 4A is a flow chart showing operation of processing example 4 for developing the wafer W. Each step will be described hereinafter. Steps similar to those in processing example 1 will be described only briefly.

<Step T1> Supply Developer (Developing Step)

The controller 41 supplies the developer to the wafer W while spinning the wafer W.

<Step T2> First Supply of Rinsing Liquid (Rinsing Step)

Then, the controller 41 supplies the rinsing liquid to the wafer W while the wafer W is kept spinning.

<Step T3> First Spin Drying (First Drying Step)

The controller 41 spins the wafer W at increased speed and dries the wafer W while scattering the rinsing liquid from the wafer W.

<Step T4> Spray $CO_2$ Solution (Neutralizing and Removing Step)

The controller 41 reduces the number of rotations of the wafer W, moves the two-fluid nozzle 51 to the treating position, and opens the switch valves 54 and 57. The two-fluid nozzle 51 generates droplets of the $CO_2$ solution by mixing the $CO_2$ gas and deionized water supplied, and sprays the droplets to the wafer W. The $CO_2$ solution sprayed spreads over the entire wafer W, and neutralizes the developer remaining in varied positions on the wafer W, e.g. on the surface of resist film and inside the resist film. As a result, the developing reaction stops completely over the entire wafer W. The product (salt) formed by the neutralization reaction easily melts into the $CO_2$ solution, and is scattered from the wafer W along with the $CO_2$ solution to be discarded.

<Step T5> Second Supply of Rinsing Liquid (Neutralizing and Removing Step)

The controller 41 supplies the rinsing liquid to the wafer W again. As a result, the $CO_2$ solution on the wafer W is replaced by the rinsing liquid.

<Step T6> Second Spin Drying

The controller 41 spins the wafer W at increased speed again and dries the wafer W while scattering the rinsing liquid from the wafer W.

According to processing example 4, as described above, the $CO_2$ solution is sprayed (step T4) to neutralize the developer and render the developer soluble in the $CO_2$ solution. In this way, the developer on the wafer W can be removed effectively from the wafer W. Thus, the developer is inhibited from remaining on the wafer W to prevent post-develop defects.

Since the $CO_2$ solution is sprayed while spinning the wafer W (step T4), the $CO_2$ solution is supplied uniformly over the entire wafer W. Consequently, the developer can be neutralized uniformly over the entire wafer W. Further, when supplying the $CO_2$ solution, physical energy can be additionally applied to the wafer W to promote the neutralization reaction of the developer.

PROCESSING EXAMPLE 5

Figure 4B:
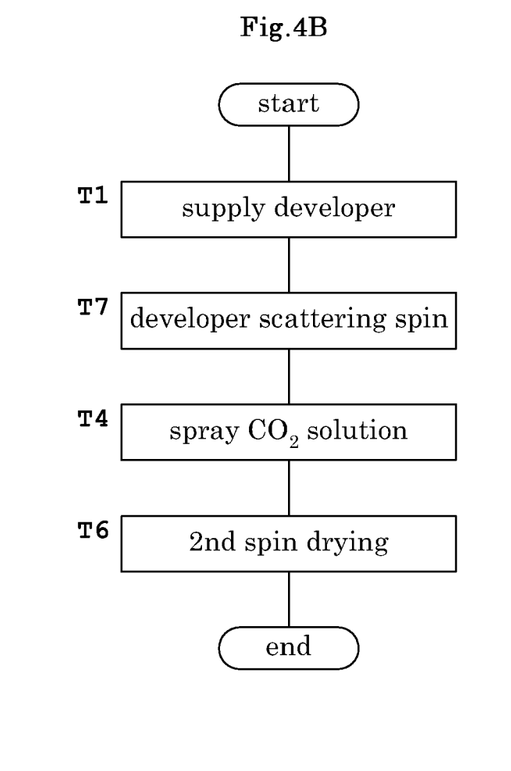
FIG. 4B is a flow chart of operation of processing example 5 for developing a substrate.

FIG. 4B is a flow chart showing operation of processing example 5 for developing a wafer. Each step will be described hereinafter. Steps similar to those in processing example 4 will be described only briefly.

First, the controller 41 supplies the developer to the wafer W while spinning the wafer W (step T1). The controller 41 spins the wafer W at increased speed to scatter the developer from the wafer W (step T7: Rinsing Step). Then, the controller 41 reduces the number of rotations of the wafer W, and sprays the $CO_2$ solution to the wafer W (step T4). Subsequently, the controller 41 spins the wafer W at increased speed and dries the wafer W while scattering the rinsing liquid from the wafer W (step T6).

In this processing example 5, as in processing example 4, the $CO_2$ solution is sprayed to remove the developer effectively from the wafer W, thereby preventing post-develop defects.

According to processing example 5, the developer is scattered from the wafer W to be discarded after the developer is supplied (step T1) and before the $CO_2$ solution is sprayed (step T4). This reduces the developer on the wafer W to minute amount. Consequently, the developer on the wafer W can be fully neutralized. The developer is effectively inhibited from remaining on the wafer W.

Where, as in processing example 5, steps T2 and T5 for supplying the rinsing liquid are omitted, the apparatus may be modified to exclude the rinse nozzle 31 and the rinsing liquid source 35 and so on associated with the nozzle 31.

PROCESSING EXAMPLE 6

Figure 4C:
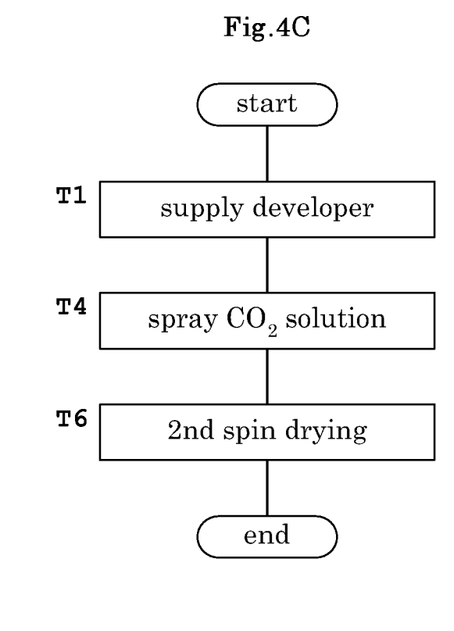
FIG. 4C is a flow chart of operation of processing example 6 for developing a substrate.

FIG. 4C is a flow chart showing operation of processing example 6 for developing a wafer. Steps similar to those in processing example 4 will be described only briefly.

The controller 41 supplies the developer to the wafer W while spinning the wafer W (step T1). Then, the controller 41 reduces the number of rotations of the wafer W, and sprays the $CO_2$ solution to the wafer W (step T4). Subsequently, the controller 41 spins the wafer W at increased speed again and dries the wafer W while scattering the rinsing liquid from the wafer W (step T6).

In this processing example 6, as in processing example 4, the $CO_2$ solution is sprayed to remove the developer effectively from the wafer W, thereby preventing post-develop defects.

In processing example 6, as in processing example 5, first and second steps T2 and T5 for supplying the rinsing liquid are omitted. Thus, the apparatus may be modified to exclude the rinse nozzle 31 and associated components.

Third Embodiment

Figure 5:
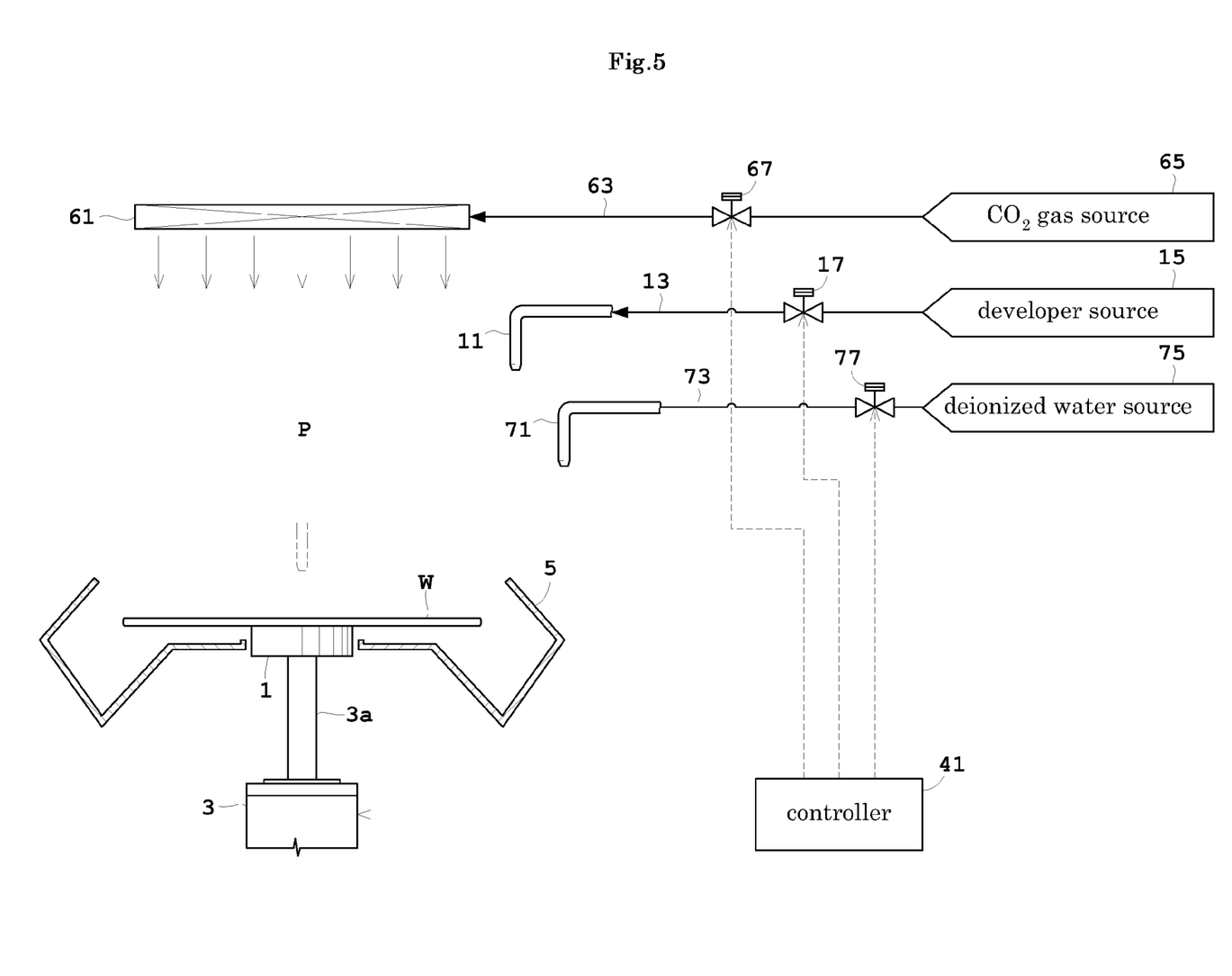
FIG. 5 is a block diagram showing an outline of a developing apparatus in a third embodiment.

A third embodiment of the invention will be described with reference to the drawings. FIG. 5 is a block diagram showing an outline of a developing apparatus in the third embodiment. Like reference signs are used to identify like components which are the same as in the first embodiment and will not particularly be described.

The apparatus in this embodiment includes a gas blowout member 61, in place of the treating solution nozzle 21 described in the first Embodiment, for supplying carbon dioxide gas (hereinafter referred to as $CO_2$ gas) to the wafer W. The gas blowout member 61 has gas piping 63 connected thereto. The other end of the gas piping 63 is connected to a $CO_2$ gas source 65. The gas piping 63 has a switch valve 67 mounted thereon for opening and closing a $CO_2$ gas flow passage. The carbon dioxide gas corresponds to the neutralizing material in this embodiment of the invention. The gas blowout member 61 corresponds to the neutralizing material supply device in this embodiment of the invention.

Further, the rinse nozzle 31 described in the first embodiment is replaced by a deionized water nozzle 71. The deionized water nozzle 51 also is supported by an arm not shown, to be movable between a treating position substantially over the center P of the wafer W (position shown in a two-dot chain line in FIG. 5) and a standby position away from over the wafer W (position shown in a solid line in FIG. 5). The deionized water nozzle 71 has one end of deionized water piping 73 connected thereto. The other end of the deionized water piping 73 is connected to a deionized water source 75.

The deionized water piping 73 has a switch valve 77 mounted thereon for opening and closing a deionized water flow passage. The deionized water nozzle 71 corresponds to the deionized water supply device in this invention.

The controller 41 further controls supply quantities of the $CO_2$ gas and deionized water by opening and closing the switch valves 67 and 77.

Next, two processing examples of the developing apparatus will be described with reference to the drawings. It is assumed here that a wafer W with resist film formed thereon is already suction-supported by the spin chuck 1.

PROCESSING EXAMPLE 7

Figure 6A:
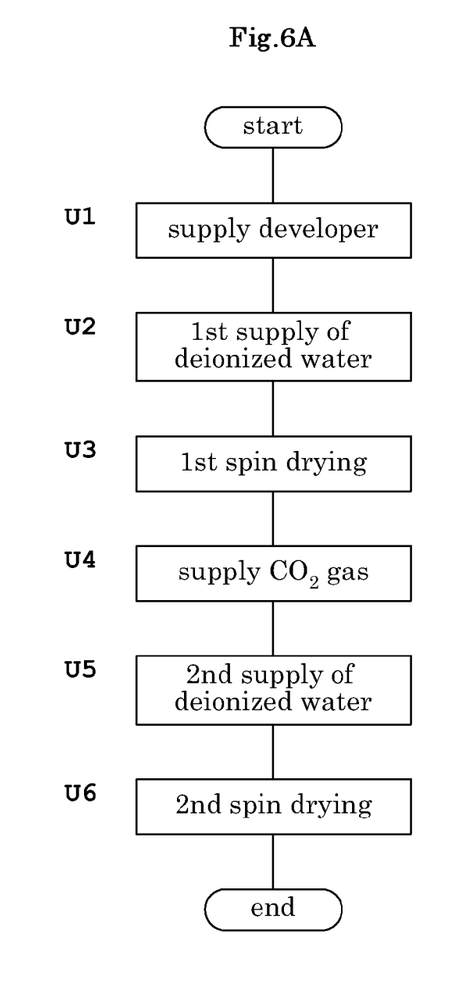
FIG. 6A is a flow chart of operation of processing example 7 for developing a substrate.

FIG. 6A is a flow chart showing operation of processing example 7 for developing the wafer W. Each step will be described hereinafter. Steps similar to those in processing example 1 will be described only briefly.

<Step U1> Supply Developer (Developing Step)
The controller 41 supplies the developer to the wafer W while spinning the wafer W.

<Step U2> First Supply of Deionized Water (Rinsing Step)
Then, the controller 41, while keeping the wafer W spinning, moves the deionized water nozzle 71 to the treating position, and opens the switch valve 77. The deionized water nozzle 71 supplies deionized water from the deionized water source 75 to the wafer W. As a result, the developer on the wafer W is washed away by the deionized water, and is discarded from the wafer W along with the deionized water. Upon lapse of a predetermined period, the controller 41 closes the switch valve 77, and returns the deionized water nozzle 71 to the standby position.

<Step U3> First Spin Drying (First Drying Step)
The controller 41 spins the wafer W at increased speed, and dries the wafer W while scattering the deionized water from the wafer W.

<Step U4> Supply $CO_2$ Gas (Neutralizing Step)
The controller 41 reduces the number of rotations of the wafer W, and opens the switch valve 67. The gas blowout member 65 blows the $CO_2$ gas from the $CO_2$ gas source 65 down to the entire surface of the wafer W. The $CO_2$ gas supplied dissolves in slight amounts of the deionized water and the like remaining on the wafer W. The deionized water and the like with the $CO_2$ gas dissolved therein acts as a treating solution to neutralize the developer remaining in varied positions on the wafer W, e.g. on the surface of resist film and inside the resist film. This neutralization reaction forms a reaction product (salt).

<Step U5> Second Supply of Deionized Water (Removing Step)
The controller 41 supplies deionized water to the wafer W again. As a result, the above reaction product (salt) dissolves in the water to be washed away.

<Step U6> Second Spin Drying
The controller 41 spins the wafer W at increased speed again and dries the wafer W while scattering the deionized water from the wafer W.

According to processing example 7, $CO_2$ gas is supplied (step U4) to neutralize the developer and render the developer soluble in deionized water. In this way, the developer on the wafer W can be removed effectively from the wafer W. Thus, the developer is inhibited from remaining on the wafer W to prevent post-develop defects.

PROCESSING EXAMPLE 8

Figure 6B:
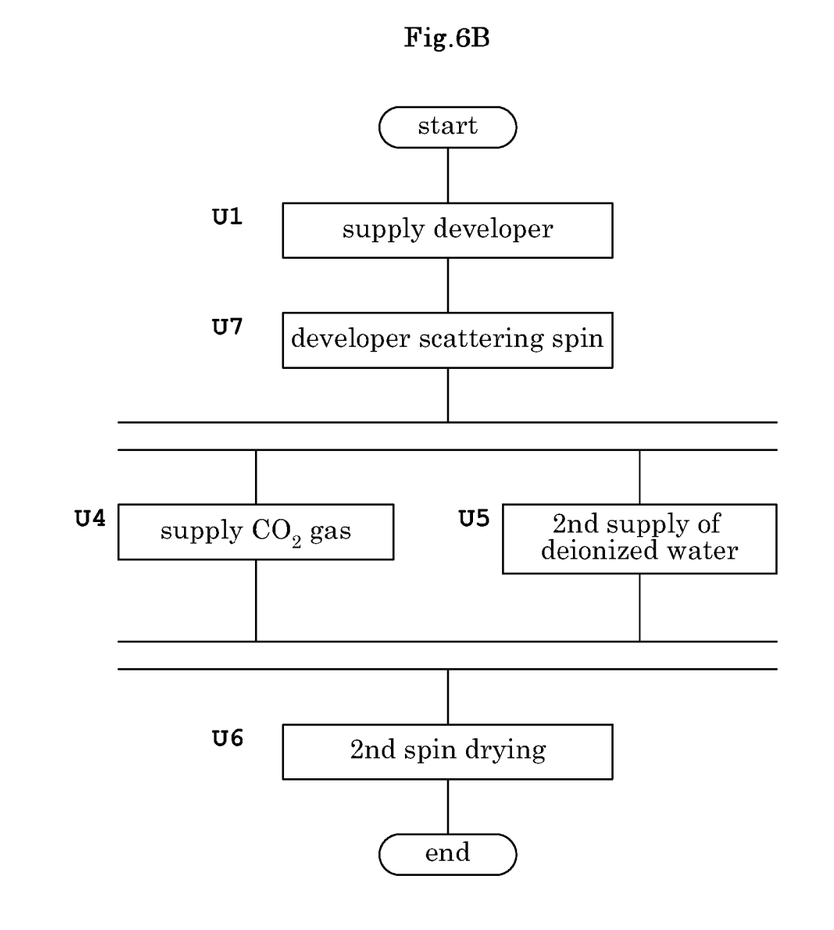
FIG. 6B is a flow chart of operation of processing example 8 for developing a substrate.

FIG. 6B is a flow chart showing operation of processing example 8 for developing a wafer. Each step will be described hereinafter. Steps similar to those in processing example 7 will be described only briefly.

<Step U1> Supply Developer (Developing Step)
The controller 41 supplies the developer to the wafer W while spinning the wafer W.

<Step U7> Developer Scattering Spin (Developer Scattering Step)
The controller 41 spins the wafer W at increased speed to scatter the developer from the wafer W.

<Steps U4 and U5> Supply $CO_2$ Gas (Neutralizing Step) and Second Supply of Deionized Water (Removing Step)
The controller 41 supplies the wafer W with $CO_2$ gas and deionized water in parallel. The periods for supplying $CO_2$ gas and deionized water are not necessarily the same, but may be different. The deionized water supplied onto the wafer W dissolves the $CO_2$ gas to become a $CO_2$ solution. This solution neutralizes the developer remaining in varied positions on the wafer W, e.g. on the surface of resist film and inside the resist film. This neutralization reaction forms a reaction product (salt), which easily melts into the $CO_2$ solution to be discarded from the wafer W along with the $CO_2$ solution.

<Step U6> Second Spin Drying
The controller 41 spins the wafer W at increased speed again and dries the wafer W while scattering the deionized water from the wafer W.

In this processing example 8, as in processing example 7, the $CO_2$ gas is supplied (step U4) to remove the developer effectively from the wafer W, thereby preventing post-develop defects.

According to processing example 8, the $CO_2$ gas and deionized water are supplied in parallel, thereby shortening the time required for carrying out the series of processes.

This invention is not limited to the foregoing embodiments, but may be modified as follows:

(1) In the foregoing embodiments, carbon dioxide is mixed or dissolved in deionized water or rinsing liquid. Such neutralizing material is not limited to carbon dioxide. For example, hydrogen peroxide or carboxylic acid may be used as neutralizing material. The neutralizing material may be formed by selecting two or more of carbon dioxide, hydrogen peroxide and carboxylic acid. The neutralizing material in this specification is not limited to substances which themselves neutralize the developer, but includes substances for neutralizing the developer.

(2) In the foregoing embodiments, the wafer W is spun when neutralizing the developer, and when the product generated by neutralization reaction is removed from the wafer W. Instead, the wafer W may be maintained still at such times. Specifically, the wafer W may be maintained still, as appropriate, when supplying the $CO_2$ solution (step S4), spraying the $CO_2$ solution (step T4) supplying the rinsing liquid for the second time (step T5), supplying the $CO_2$ gas (step U4), and supplying the deionized water (step U5).

(3) In the foregoing embodiments, the developer nozzle 11, treating solution nozzle 21, rinse nozzle 31, two-fluid nozzle 51 and deionized water nozzle 71 all have the treating position located substantially over the center P of the wafer W. This is not limitative. For example, these valves may supply the developer and so on while moving over the wafer W. For example, the developer nozzle 11 may supply the developer while moving from a position outside the edge of the wafer W to a position substantially over the center P of the wafer W.

(4) In the second embodiment described hereinbefore, the two-fluid nozzle 51 is constructed to receive $CO_2$ gas and deionized water. This is not limitative. For example, the deionized water source 56 may be replaced with a treating solution source for supplying a treating solution containing a neutralizing material to the two-fluid nozzle 51. In this case, the $CO_2$ gas source 53 may be replaced with an inert gas source for supplying an inert gas such as nitrogen gas to the two-fluid nozzle 51. Alternatively, the $CO_2$ gas source 53 may be an air source for supplying compressed air.

(5) In the second embodiment, processing examples 4-6 have been described, which are not limitative. In processing example 4, for example, it is possible to omit the step of supplying the rinsing liquid for the second time (step T5). In processing examples 5 and 6, a change may be made to supply the rinsing liquid for the second time (step T5) after the $CO_2$ solution is sprayed (step T4) and before the second spin drying (step T6).

(6) In the third embodiment, processing examples 7 and 8 have been described, which are not limitative. In processing example 7, for example, a change may be made to carry out the developer scattering spin (step U7) after supplying the developer (step U1) and before supplying the $CO_2$ gas (step U4). In processing example 8, a change may be made to supply the rinsing liquid for the first time (step U2) and/or carry out the first spin drying (step U3) before supplying the developer (step U1) and before supplying the $CO_2$ gas (step U4) and supplying the rinsing liquid for the second time (step U5).

(7) The foregoing embodiments and the components and processes of these embodiments may be combined in varied ways as appropriate.

This invention may be embodied in other specific forms without departing from the spirit or essential attributes thereof and, accordingly, reference should be made to the appended claims, rather than to the foregoing specification, as indicating the scope of the invention.

What is claimed is:

1. A method for developing a substrate, the method comprising:
   supplying a developer to the substrate; and
   supplying a treating solution including a neutralizing material to the substrate;
   neutralizing the developer;
   removing the developer from the substrate;
   supplying a rinsing liquid to the substrate; and
   scattering the rinsing liquid from the substrate by spinning the substrate, wherein supplying the rinsing liquid and scattering the rinsing liquid are performed after supplying the developer to the substrate and before supplying the treating solution.

2. The method of claim 1 wherein the treating solution comprises an acid.

3. The method of claim 1 wherein the neutralizing material includes at least one of carbon dioxide, hydrogen peroxide, or carboxylic acid.

4. The method of claim 1 wherein neutralizing the developer and removing the developer comprises spraying droplets of the treating solution on the substrate.

5. The method of claim 1 wherein the neutralizing the developer and removing the developer comprises supplying the treating solution to the substrate in a spin.

6. The method of claim 1 further comprising:
   supplying a rinsing liquid to the substrate;
   scattering the developer from the substrate by spinning the substrate, wherein
   supplying a rinsing liquid and scattering the developer are performed after supplying a developer to the substrate and before supplying a treating solution.

7. The method of claim 1 further comprising scattering the developer from the substrate by spinning the substrate, wherein scattering the developer is performed after supplying a developer to the substrate and before supplying a treating solution.

8. The method of claim 1 wherein scattering the rinsing liquid is executed to dry the substrate.

9. A method for developing a substrate, the method comprising:
   performing a developing step including supplying a developer to the substrate;
   performing a neutralizing step including supplying a neutralizing material to the substrate to neutralize the developer;
   performing a removing step including supplying a cleaning liquid to the substrate and removing a product formed by neutralization of the developer from the substrate; and
   performing a rinsing step for supplying a rinsing liquid to the substrate and a first drying step for scattering the rinsing liquid from the substrate by spinning the substrate, wherein the rinsing step and the first drying step are performed after the developing step and before the neutralizing step.

10. The method of claim 9 wherein the neutralizing step is executed to direct carbon dioxide gas to the substrate.

11. The method of claim 9 wherein the first drying step is executed to dry the substrate.

* * * * *